(12) United States Patent
Mori

(10) Patent No.: US 6,172,503 B1
(45) Date of Patent: Jan. 9, 2001

(54) MAGNETIC RESONANCE IMAGING APPARATUS AND RF COIL TO BE USED THEREFOR

(75) Inventor: Issei Mori, Tochigi-ken (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/265,548

(22) Filed: Mar. 9, 1999

(30) Foreign Application Priority Data

Mar. 11, 1998 (JP) .................................................. 10-059784

(51) Int. Cl.$^7$ ........................................................ G01V 3/18
(52) U.S. Cl. ............................................ 324/318; 324/322
(58) Field of Search ..................................... 324/300–322, 324/318, 307, 309, 311, 314

(56) References Cited

U.S. PATENT DOCUMENTS

| | | | |
|---|---|---|---|
| 4,721,913 | 1/1988 | Hyde et al. | 324/318 |
| 4,878,022 | 10/1989 | Carlson | 324/318 |
| 5,473,251 | 12/1995 | Mori | 324/318 |

FOREIGN PATENT DOCUMENTS

| | | |
|---|---|---|
| HO5-49614 | 8/1992 | (JP) . |
| 9-187437 * | 7/1997 | (JP) . |

* cited by examiner

*Primary Examiner*—Christine Oda
*Assistant Examiner*—Tiffany A. Fetzner
(74) *Attorney, Agent, or Firm*—Nixon & Vanderhye P.C.

(57) ABSTRACT

The RF coil is an 8-shaped coil applied to a receiving coil, for example, of a so-called vertical field magnetic resonance imaging apparatus, and comprises a central conductor which is wide in a y-axis direction and a return path connected to the central conductor and provided to bypass the central conductor. The central conductor has an magnetic field sensitivity of interest in a y-axis direction orthogonal to a static magnetic field $B_0$ direction (a z-axis direction). Since the return path has no magnetic field sensitivity of interest, the return path is provided to bypass the central conductor in order to prevent the magnetic field of the return path from interfering with the interest magnetic field of the central conductor.

23 Claims, 6 Drawing Sheets

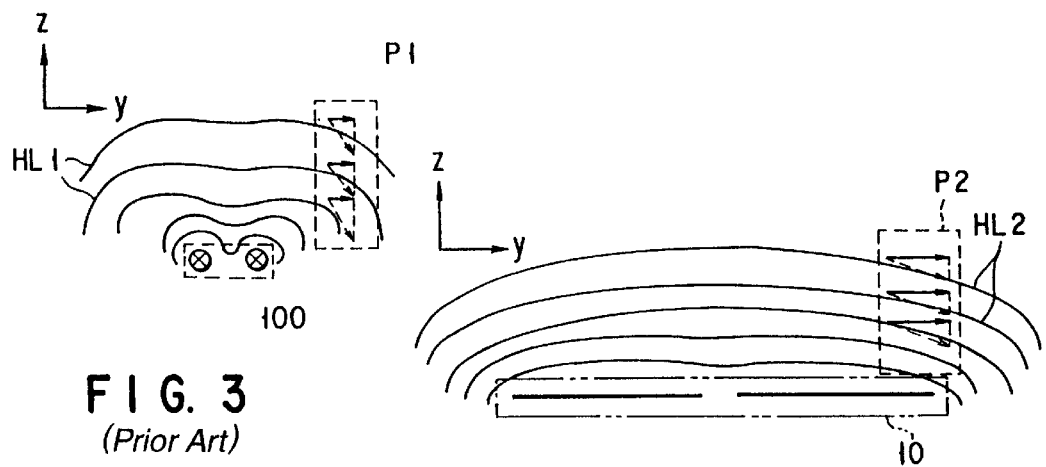
FIG. 3 (Prior Art)
FIG. 4
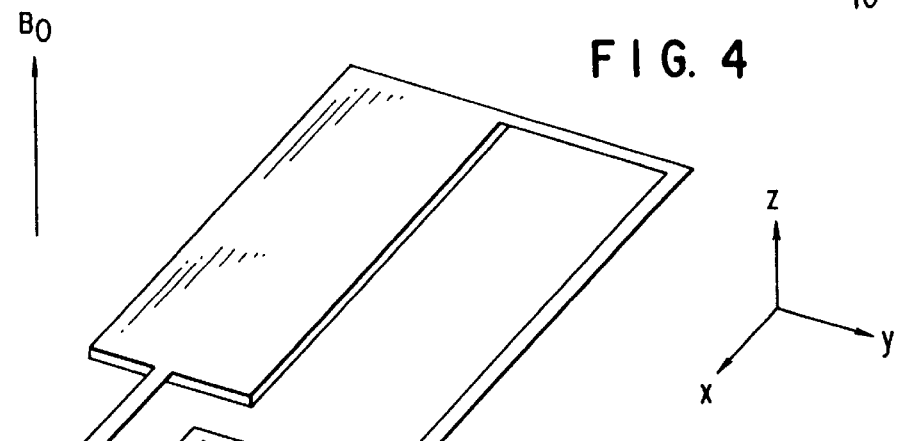
FIG. 5
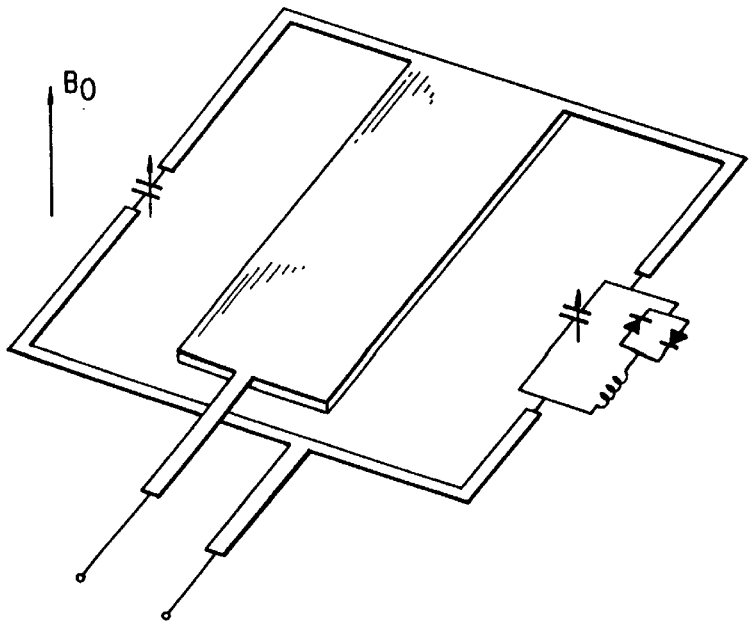
FIG. 6

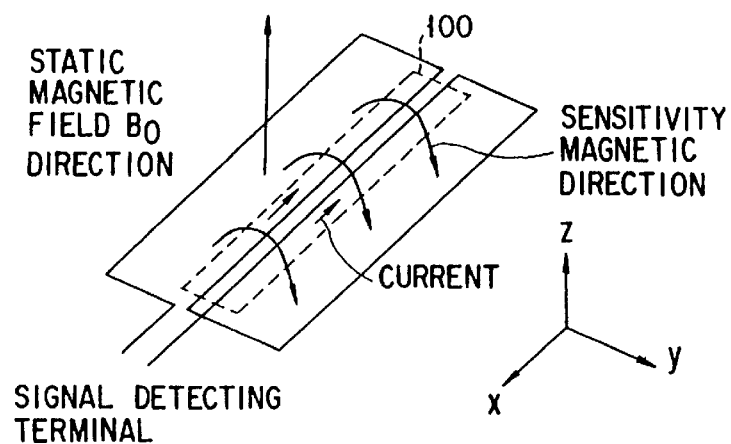
FIG. 13
(Prior Art)
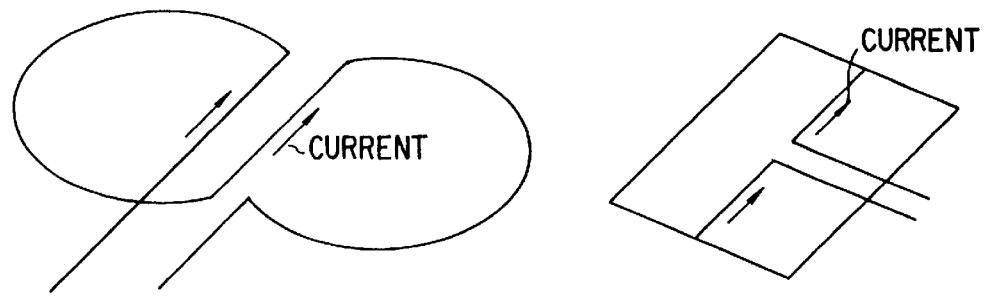
FIG. 14
(Prior Art)
FIG. 15
(Prior Art)
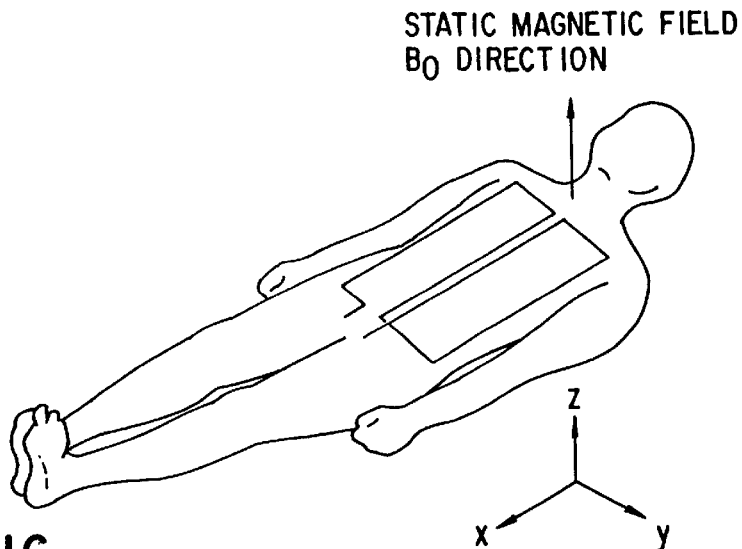
FIG. 16
(Prior Art)

MAGNETIC RESONANCE IMAGING APPARATUS AND RF COIL TO BE USED THEREFOR

BACKGROUND OF THE INVENTION

The present invention relates to a magnetic resonance imaging apparatus for obtaining the image of a subject by utilizing NMR (Nuclear Magnetic Resonance) phenomenon, and an RF coil to be used therefor.

Various RF coils have been used for the magnetic resonance imaging apparatus. Among others, a surface coil has been often used which is obtained by annularly forming a conductor to be a coil face. In addition to circular and rectangular surface coils, an 8-shaped coil has been often used.

The 8-shaped coil is shown in FIG. 13 and has been often used for imaging by so-called vertical field MRI in which the direction of a static magnetic field is substantially vertical to the body axis of the subject. The 8-shaped coil described herein indicates a general coil in which a conductor in a central portion (hereinafter referred to as a "central conductor") 100 has a sensitivity to an MR signal of a subject region and a current return path is provided to bypass the outside of the central conductor 100. A static magnetic field $B_0$ direction is a z direction.

FIG. 14 shows another example of the 8-shaped coil according to the prior art. The 8-shaped coil shown in FIG. 14 does not have a wholly square 8-shape shown in FIG. 13 but has a smooth 8-shape. A coil having a shape shown in FIG. 15 is also included in the 8-shaped coil.

FIG. 16 shows the positional relationship between the subject and the 8-shaped coil. In a case where an ordinary circular or rectangular shaped surface coil is put below the medulla spinals of a lying subject to carry out imaging of the medulla spinals of the subject by the vertical field MRI, a sensitivity magnetic field direction is the z direction which is parallel with the direction of a static magnetic field and has no effective MRI signal. In the 8-shaped coil, the direction of the magnetic field where the central conductor has a sensitivity is set to a direction (y direction) orthogonal to a transit direction (x direction) of the central conductor and a region having the sensitivity is placed in the vicinity of the central conductor. Thus, if the 8-shaped coil is provided in such a manner that the transit direction of the central conductor is parallel with the transit direction of the medulla spinals (x direction), a magnetic field sensitivity region in a direction along the medulla spinals can be obtained. In this case, the magnetic field sensitivity direction is orthogonal to the static magnetic field. In this direction, an effective MRI signal is obtained, a long sensitivity region is provided in the direction of the medulla spinals and an RF coil (surface coil) useful for a vertical field MRI apparatus is obtained.

However, the RF coil according to the prior art has a small effective sensitivity region in a transverse direction (y direction) as is apparent from FIG. 16. For this reason, there is a problem in that the use of the RF coil is restricted to only diagnosis of a slender subject portion such as the medulla spinals.

In a case where an 8-shaped coil having a sensitivity concentrated only in the vicinity of the central conductor is used to carry out imaging of the medulla spinals, for example, a glaring image is obtained in a portion close to the body surface of the subject and the sensitivity is rapidly lowered in a portion greatly apart from the body surface. According to such an uneven sensitivity, there are problems in that S/N tends to be lacking in a certain deep region and a final image is diagnosed with difficulty.

As one of well-known techniques, a plurality of surface coils having sensitivity magnetic field directions different from each other are combined to form a surface QD (Quadrature Detection) coil having higher S/N. In general, this technique has been often used in an MRI apparatus in which the direction of a static magnetic field $B_0$ is parallel with the direction of the body axis of a subject as shown in FIG. 17.

In a case where the surface QD coil shown in FIG. 17 is used for the vertical field MRI apparatus, the following problem arises. More specifically, a rectangular coil 110 shown in FIG. 17 has no sensitivity to an MRI signal sent from a medulla spinals portion. Therefore, the S/N cannot be enhanced.

Therefore, it is also supposed that a surface QD coil is constituted by overlapping two 8-shaped coils 130 and 140 orthogonally to each other as shown in FIG. 18.

Also in this case, however, the following problem arises. More specifically, the surface QD coil can have high S/N only in a region 150 in the vicinity of a portion where both central conductors intersect. Consequently, it is impossible to keep a region which is long in the x direction and has high S/N. For this reason, in a case where the position of an affected part is precisely grasped in advance, a part of the medulla spinals can be observed with high quality of image. However, the long region of the medulla spinals cannot be observed. Similarly, high S/N can be obtained in a small visual field in the y-direction. Therefore, the use is limited.

BRIEF SUMMARY OF THE INVENTION

The present invention has been made to cope with the above-mentioned circumstances, and it is an object of the present invention to provide an RF coil of a magnetic resonance imaging apparatus capable of enlarging an effective sensitivity region in the direction of a magnetic field orthogonal to the direction of a static magnetic field, thereby enhancing quality of image in an interest region over the wide range of a subject.

According to the present invention, there is provided an RF coil to be used for a magnetic resonance imaging apparatus, comprising: a wide plate-shaped conductor having an magnetic field sensitivity of interest; and a return path connected to the plate-shaped conductor for bypassing the plate-shaped conductor.

According to the present invention, there is provided an RF coil to be used for a magnetic resonance imaging apparatus, comprising: a conductor portion including a plurality of conductor paths which are split at a predetermined starting point and join at a predetermined end point, and having an magnetic field sensitivity of interest; and a return path connected to the conductor portion for bypassing the conductor portion.

According to the present invention, since the wide plate-shaped conductor or the conductor portion including a plurality of conductor paths which are split at a predetermined starting point and join at a predetermined end point is provided, the effective sensitivity region in the direction of the magnetic field orthogonal to the direction of the static magnetic field can be enlarged so that the quality of image in the interest region can be enhanced over the wide range of the subject.

Furthermore, it is possible to obtain an advantage that the sensitivity is not rapidly reduced in the longitudinal direction of the subject.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing distribution of a magnetic field on a yz plane in the vicinity of a central conductor 100 of an 8-shaped coil according to the prior art;

FIG. 4 is a view showing distribution of a magnetic field on a yz plane in the vicinity of a central conductor 10 of an 8-shaped coil according to the first embodiment;

FIG. 5 is a perspective view showing an RF coil according to a first alternative of the first embodiment of the present invention;

FIG. 6 is a perspective view showing an RF coil according to a second alternative of the first embodiment of the present invention;

FIG. 13 is a perspective view showing an example of an 8-shaped coil according to the prior art;

FIG. 14 is a perspective view showing another example of the 8-shaped coil according to the prior art;

FIG. 15 is a perspective view showing yet another example of the 8-shaped coil according to the prior art;

FIG. 16 is a view showing the positional relationship between the 8-shaped coil according to the prior art and a subject;

DETAILED DESCRIPTION OF THE INVENTION

An embodiment of the present invention will be described below with reference to the drawings.

(First Embodiment)

Figure 1:
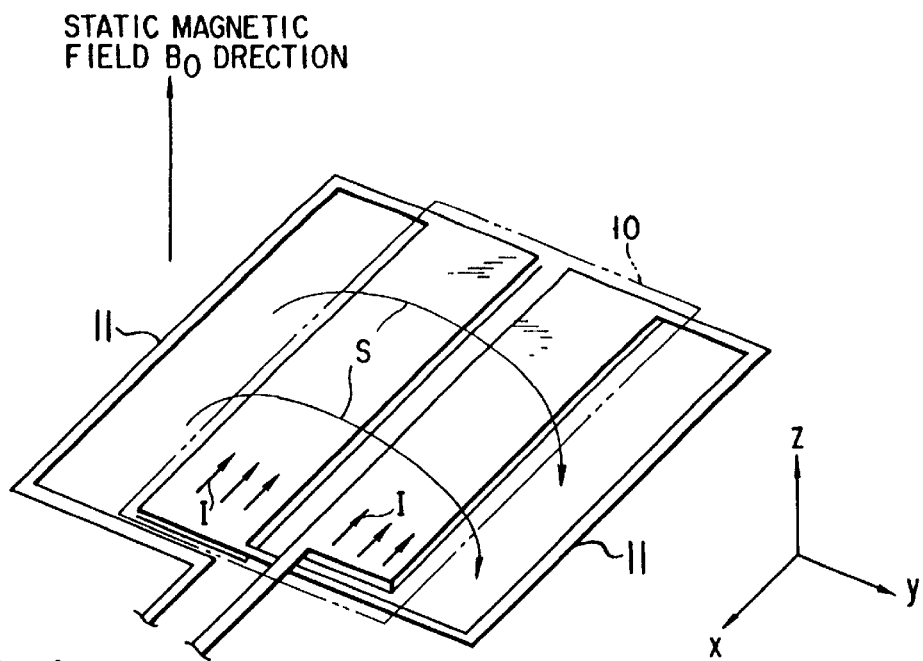
FIG. 1 is a perspective view showing an RF coil of a magnetic resonance imaging apparatus according to a first embodiment of the present invention.

FIG. 1 is a perspective view showing the appearance of an RF coil of a magnetic resonance imaging apparatus according to a first embodiment of the present invention. In FIG. 1, an arrow I denotes a direction of a current, and an arrow S denotes a direction of a sensitivity magnetic field.

The RF coil according to the present embodiment is an 8-shaped coil applied to a receiving coil, for example, of a so-called vertical field magnetic resonance imaging apparatus, and comprises a central conductor 10 which is wide in a y-axis direction and a return path 11 connected to the central conductor 10 and provided to bypass the central conductor 10. The central conductor 10 has an magnetic field sensitivity of interest in a y-axis direction orthogonal to a static magnetic field $B_0$ direction (a z-axis direction). Since the return path 11 has no magnetic field sensitivity of interest, the return path 11 is provided to bypass the central conductor 10 in order to prevent the magnetic field of the return path 11 from interfering with the interest magnetic field of the central conductor 10.

The RF coil according to the present embodiment comprises a tuning circuit, a preamplifier and other circuit blocks which are not shown but are the same as usually used.

Figure 2:
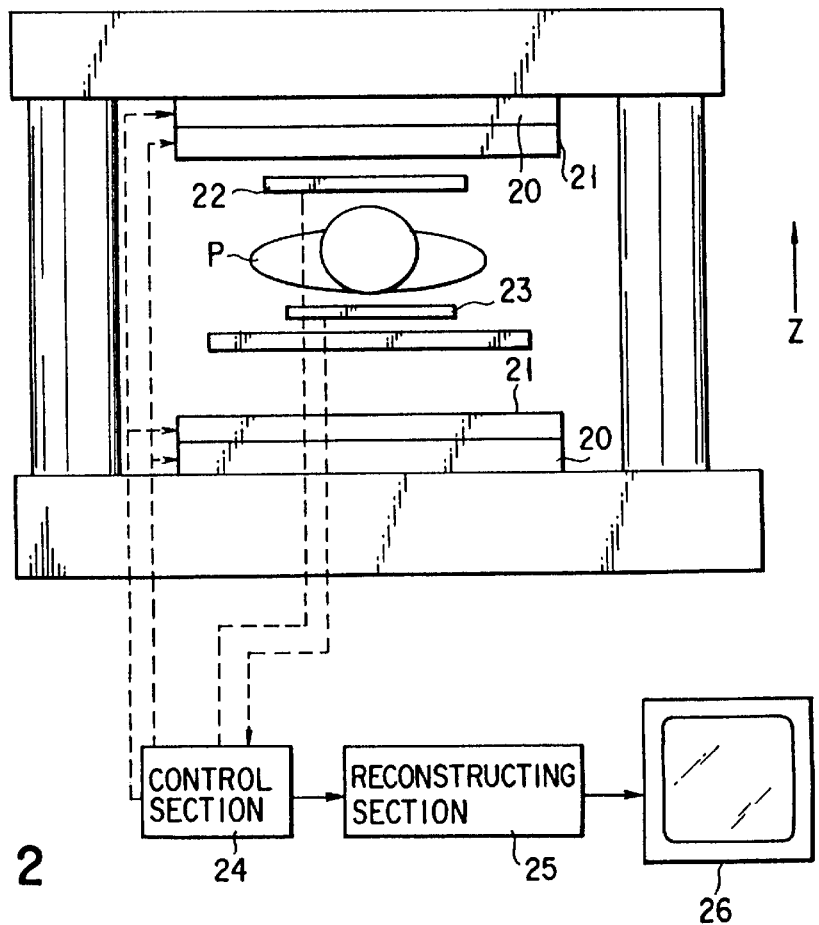
FIG. 2 is a view showing the whole schematic structure of a vertical field magnetic resonance imaging apparatus including an 8-shape according to the present invention.

FIG. 2 is a view showing the whole schematic structure of a vertical field magnetic resonance imaging apparatus including an 8-shape according to the present invention. The present apparatus comprises a static magnetic field magnet section 20 for generating a static magnetic field to be applied to a subject, a gradient magnetic field coil section 21 for generating a gradient magnetic field to be applied to a subject P, a high-frequency pulse generating section (a transmitting RF coil) 22 for generating a high-frequency pulse related to proton excitation, a control section 24 for executing a pulse sequence to apply the gradient magnetic field and the high-frequency pulse to the subject P provided in the static magnetic field on the predetermined conditions, a reconstructing section 25 for reconstructing an echo signal thus obtained to obtain the magnetic resonance image of the subject P, and a display section 26 for displaying the reconstructed magnetic resonance image.

The above-mentioned 8-shaped coil 23 according to the present invention serves to receive (collect) the echo signal related to the proton excitation by the execution of the pulse sequence.

The sensitivity of the 8-shaped coil to be used as receiver in the MRI according to the present embodiment will be described below. The sensitivity characteristics of the receiving coil can be represented by the magnetic field distribution characteristics obtained by imaginatively supplying power to the receiving coil.

FIG. 3 is a view showing distribution of a magnetic field on a yz plane in the vicinity of the central conductor 100 of the 8-shaped coil according to the prior art shown in FIG. 13, and FIG. 4 is a view showing distribution of a magnetic field on a yz plane in the vicinity of the central conductor 10 of the 8-shaped coil according to the present embodiment.

A magnetic line of force (HL1 in FIG. 3 and HL2 in FIG. 4) constituting the distribution of the magnetic field is formed by each 8-shaped coil when power is supplied imaginatively from the outside through a signal detecting terminal.

When the 8-shaped coil is used as receiver, it detects a fluctuation in a magnetic line of force parallel with the magnetic lines of force HL1 and HL2. In this case, a place in which the magnetic lines of force HL1 and HL2 are denser has a higher sensitivity.

In the vertical field MRI, an MR signal sent from the subject appears as a fluctuation in the magnetic line of force in the xy plane. In other words, it means that a sensitivity to the MR signal is higher if a component in the y direction of the magnetic line of force is greater, that is, the magnetic line of force in the y direction is denser.

Shoulders (P1 in FIG. 3 and P2 in FIG. 4) of the distribution of the magnetic line of force will be noted.

By comparing the components in the y direction of the magnetic lines of force on P1 and P2 with each other, the component in the y direction on P2 is greater than on P1. Note that P2 is father away from the center than P1. Accordingly, the central conductor 10 of the RF coil according to the present embodiment has a high sensitivity region which is wider in the y direction than the central conductor 100 shown in FIG. 2.

According to Ampere rule, a magnetic field intensity is represented by "a current/a surrounding length of a magnetic line of force around the current".

In FIG. 4, the wide conductor is used. Consequently, a current source is distributed widely in a y-axis direction. Therefore, a change rate of the surrounding length of the magnetic line of force between the vicinal position of the current and a position which is slightly apart from the current in a z-axis direction is smaller than in FIG. 3.

Consequently, it is possible to obtain advantages that the 8-shaped coil according to the present embodiment has a smaller degree of a decrease in the density of the magnetic line of force in the z-axis direction than the 8-shaped coil having no wide conductor shown in FIG. 3 and has no rapid reduction in the sensitivity to the longitudinal direction (z direction) of the subject.

As described above, the 8-shaped coil according to the present embodiment comprises the central conductor 10 which has the magnetic field sensitivity of interest and is wide in the y-axis direction, and the return path 11 connected to the central conductor 10 for bypassing the central conductor 10. According to such an 8-shaped coil, particularly, the central conductor 10 is wide in the y-axis direction. Therefore, the effective sensitivity region in the direction of the magnetic field orthogonal to the direction of the static magnetic field can be enlarged so that the quality of image in the interest region can be enhanced over the wide range of the subject.

Furthermore, it is possible to obtain an advantage that the sensitivity is not rapidly reduced in the longitudinal direction (the z-axis direction) of the subject.

The advantages obtained by the first embodiment can also be obtained by coils having other geometric shapes as well as the above-mentioned 8-shaped coil.

For example, an RF coil consisting of a wide and plate-like central conductor and one return path connected to the central conductor and arranged to detour the central conductor, as shown in FIG. 5 or an RF coil consisting of a wide and plate-like central conductor and two return paths connected to the central conductor and arranged to detour the central conductor, as shown in FIG. 6 can exhibit an advantage similar to that of the above-described embodiment. It should be noted that naturally a variable capacitor for tuning the impedance or a trap circuit, which will be described later, may be provided as shown in FIG. 6.

The RF coil shown in FIG. 6 is more advantageous than that shown in FIG. 5 in terms of that the influence of the return paths on the magnetic distribution becomes more regular.

(Second Embodiment)

A second embodiment of the present invention will be described below.

Figure 7:
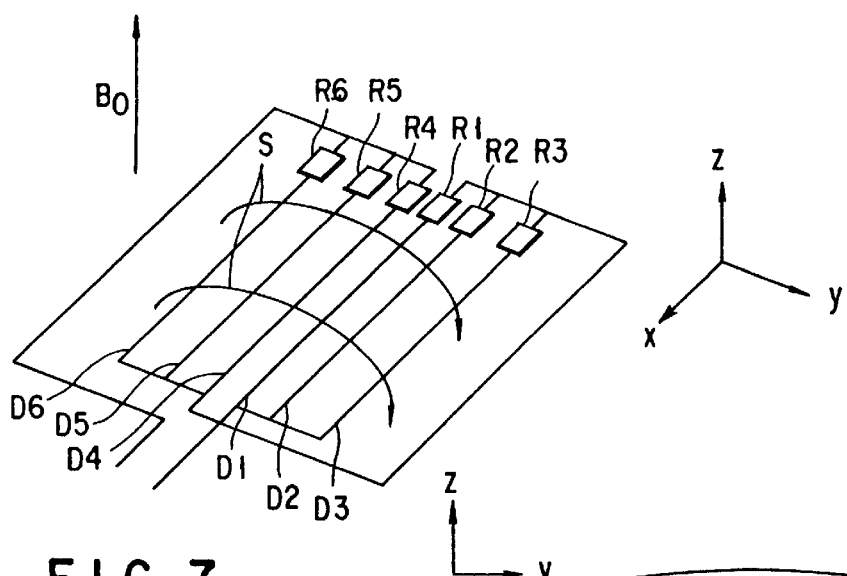
FIG. 7 is a perspective view showing an RF coil of a magnetic resonance imaging apparatus according to a second embodiment of the present invention.

FIG. 7 is a perspective view showing an RF coil of a magnetic resonance imaging apparatus according to the second embodiment of the present invention. The RF coil according to the present embodiment is obtained by substituting a plurality of discrete current paths for the central conductor (wide conductor) 10 of the RF coil according to the first embodiment.

As shown in FIG. 7, the central conductor of the RF coil according to the present embodiment is constituted by a plurality of current paths (D1, D2, . . . D6) which are split at a predetermined starting point and join at a predetermined end point to provide widened magnetic field lines S.

The central conductor of the RF coil according to the present embodiment does not generate an eddy current by a fluctuation in the gradient magnetic field differently from the central conductor formed by the wide conductor 10 according to the first embodiment. Consequently, the eddy current does not disturb a static magnetic field and a gradient magnetic field.

In some cases where the eddy current is generated, excellent MR images cannot be obtained depending on design of a pulse sequence.

Reactance elements R1, R2, . . . R6 are inserted into the discrete current paths D1 to D6 of the central portion as shown by square blocks in FIG. 7, respectively. A capacitor is usually used for the reactance elements. The capacitor can prevent the eddy current from being generated by a change in the gradient magnetic field. In FIG. 5, the reactance elements are inserted into all the current paths. It is a matter of course that the reactance element may be inserted into a part of the current paths to take a countermeasure against the eddy current.

Even if there is no problem related to the eddy current, the insertion of the reactance elements is significant. The reason is that the impedance of the split current path can be adjusted by regulating the reactance value of the reactance element. Consequently, a current balance between the split current paths can be changed. This means that a sensitivity distribution pattern in a y direction can be adjusted if necessary.

Figure 8:
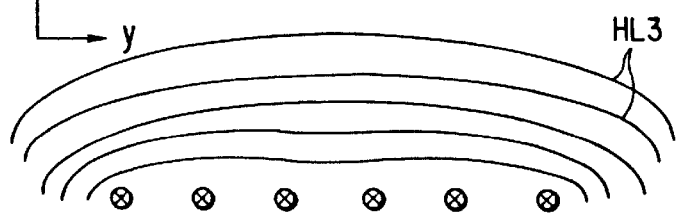
FIG. 8 is a view showing distribution of a magnetic line of force on a yz plane in the vicinity of central conductors (D1 to D6) of the RF coil according to the second embodiment.

FIG. 8 is a view showing distribution of a magnetic line of force on a yz plane in the vicinity of the central conductor (D1 to D6) of the RF coil according to the present embodiment. Current distribution obtained when a plurality of conductors are discretely provided as in the present embodiment generally approximates the current distribution of the wide conductor 10 according to the first embodiment. For this reason, similarly, the distribution of the magnetic line of force HL3 makes no great difference from that in FIG. 4.

In the RF coil according to the present embodiment, accordingly, a sensitivity region can be enlarged in a transverse direction (y direction) with respect to the transit direction of the central conductor in the same manner as in the first embodiment, and a tendency to cause a rapid reduction in the sensitivity can be alleviated in the longitudinal direction (z direction) of a subject.

Figure 9:
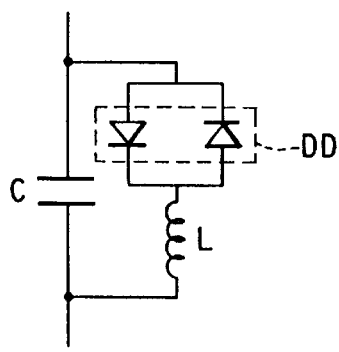
FIG. 9 is a circuit diagram showing a trap circuit according to an alternative of the second embodiment.

FIG. 9 is a circuit diagram showing a trap circuit according to an alternative of the second embodiment. While the reactance elements R1 to R6 are inserted into the current paths D1 to D6 constituting the central conductor respectively as described above, the reactance elements may be utilized for a part of the trap circuit. The trap circuit is well known and serves to prevent a strong induced current from being generated on an 8-shaped coil when the subject is excited by an external high-frequency magnetic field.

Herein, the trap circuit consists of diodes DD connected back to back to each other and made conductive at a threshold voltage or higher, and an LC resonance circuit which resonate at a Larmor frequency when the diode DD becomes conductive, and exhibits a high impedance due to the resonance.

When a strong RF magnetic field for excitation is exposed from the transmission RF coil during the transmission, an induced electromotive force is created in the RF coil. In this case, a threshold voltage or higher is applied to the diode DD and therefore it is made conductive, and the LC resonance circuit resonates.

Consequently, the trap circuit exhibits a high parallel resonance impedance, and a large current does not flow in the RF coil. To the variable capacitor for tuning adjustment, the variable capacitor for matching adjustment (note these capacitors are weak elements as varactor diodes in many cases) and the preamplifier, little voltage is applied by the induced electromotive force. Further, since there is little current flowing due to the induced electromotive force, the excitation RF magnetic field is not disturbed by the magnetic filed created by the inductive current.

Furthermore, the above-mentioned reactance element R is utilized as a capacitance C or an inductance L. Thus, useless circuit losses can be minimized by using the reactance element R for a plurality of purposes. In addition, the size of the apparatus can be reduced and a cost can be cut down.

(Third Embodiment)

There will be described a third embodiment in which an 8-shaped coil in accordance with the present invention is applied to a surface QD coil.

As described above, higher S/N can be obtained by a surface QD coil constituted by combining a plurality of surface coils having sensitivity magnetic field directions different from each other.

Figure 10:
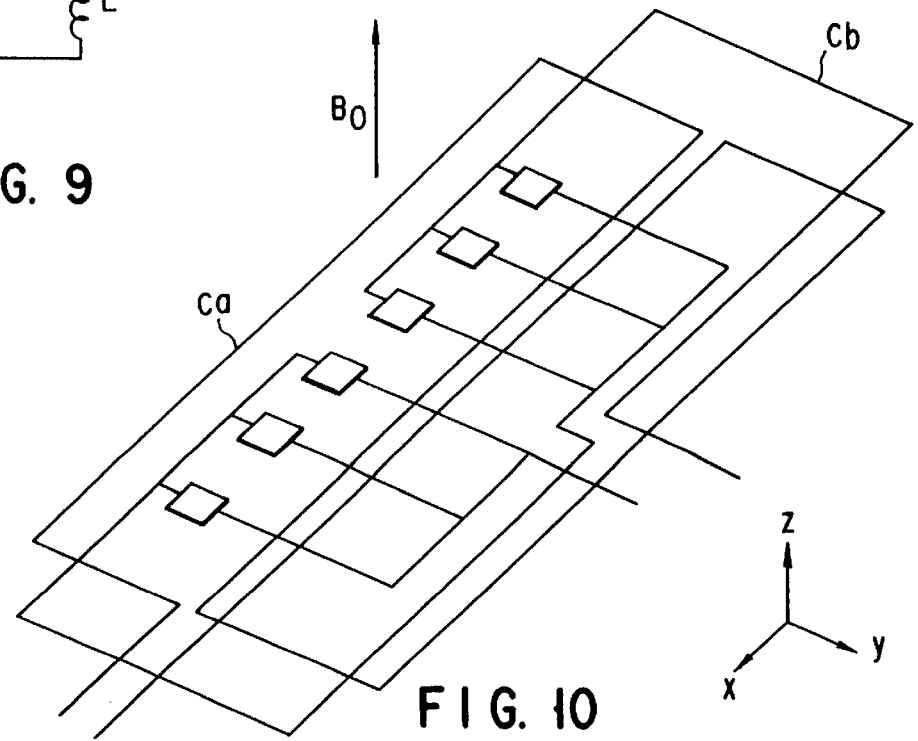
FIG. 10 is a perspective view showing an example of a surface QD coil of a vertical field MRI apparatus according to a third embodiment of the present invention.

FIG. 10 is a perspective view showing a surface QD coil suitable for a vertical field MRI apparatus according to the third embodiment of the present invention.

The surface QD coil in accordance with the present embodiment has respective sensitivities for two magnetic fields which are almost orthogonal to each other, and comprises first and second (RF) coils Ca and Cb for detecting two signals corresponding to the magnetic fields, and a signal processing circuit (not shown) for shifting, by substantially 90°, one of phases of output signals sent from the first and second coils Ca and Cb with respect to the other phase and for synthesizing the two output signals into one signal.

The first coil Ca is a conventional 8-shaped coil having a central conductor extended in an x direction. The second coil Cb is the same as in the second embodiment, and is an 8-shaped coil comprising a central conductor section which is formed by a plurality of conductor paths split in a predetermined starting point and joining at a predetermined end point and has an interest magnetic field sensitivity, and a return path connected to the end point of the central conductor section for bypassing the central conductor section, the central conductor section having a current transit direction of y.

Also in the present embodiment, the direction of a static magnetic field $B_0$ is z.

According to the present embodiment, it is possible to obtain a surface QD coil which is long in the x direction and has a high S/N region. Also in a case where the interest region of a subject is long in the x direction, imaging can be carried out with high S/N in the long region.

In the surface QD coil according to the present embodiment, the sensitivity vector directions of the first and second coils Ca and Cb are almost orthogonal to each other, and noise distributions of the coils have different sources independently. The standard deviation of a total noise histogram of each of the coils is equal to the square root of the summed square values of the standard deviation of the noise histogram for the coil. If the standard deviation of the noise distribution for each coil is 1, the square root of the sum is equal to square root 2. In other words, the S/N can be increased by the square root 2 times.

Figure 11:
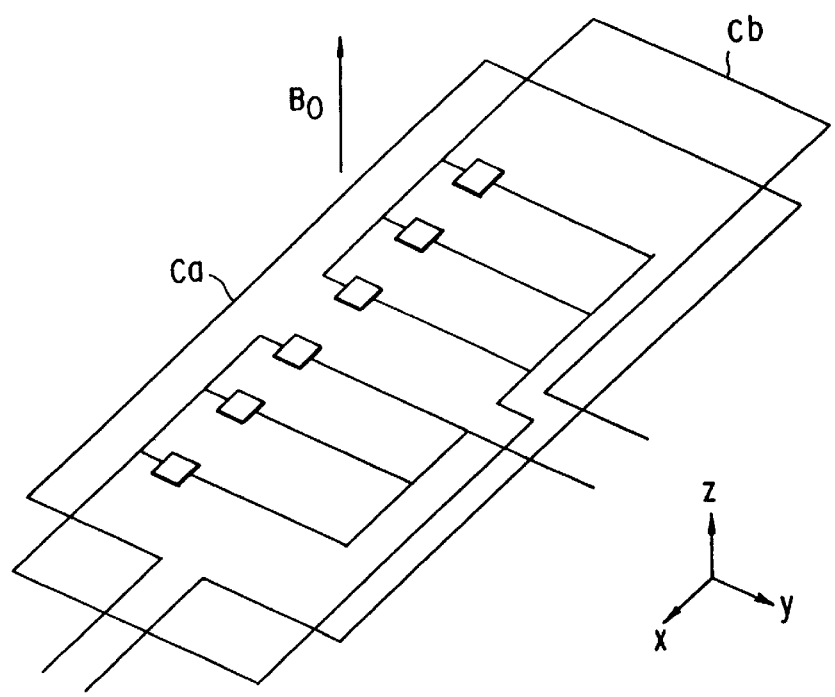
FIG. 11 is a perspective view showing another example of the surface QD coil of the vertical field MRI apparatus according to the third embodiment of the present invention.

As shown in FIG. 11, the first coil Ca may be a rectangular coil. However, this configuration is useful for the system whose $B_0$ is in x or y direction but is not useful if $B_0$ is z direction.

Figure 12:
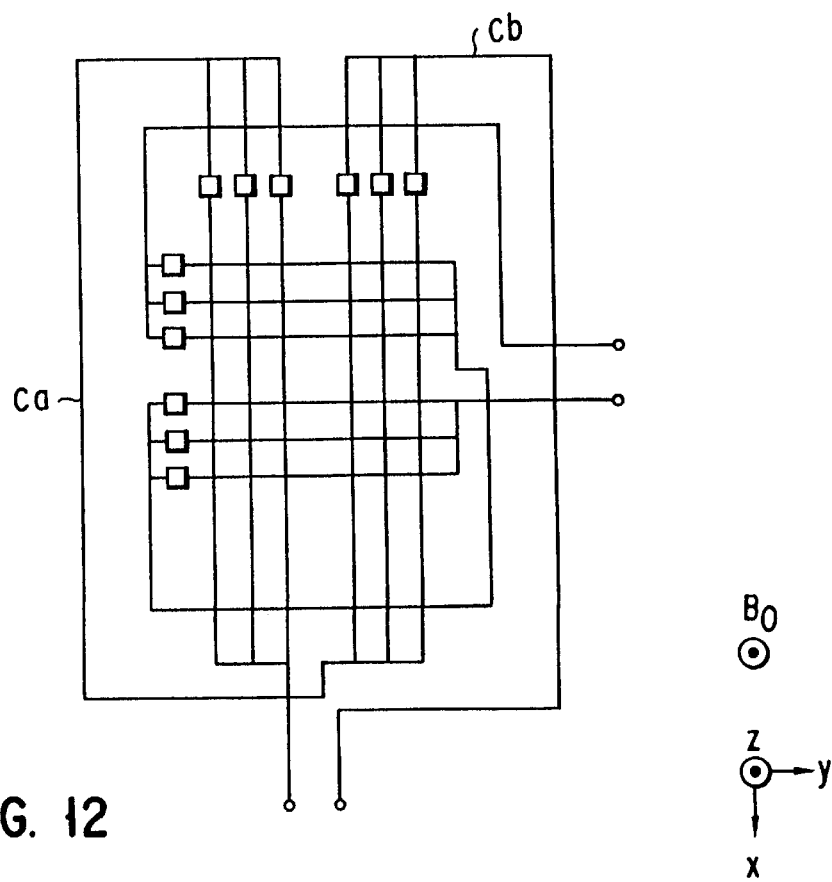
FIG. 12 is a perspective view showing yet another example of the surface QD coil of the vertical field MRI apparatus according to the third embodiment of the present invention.
Figure 17:
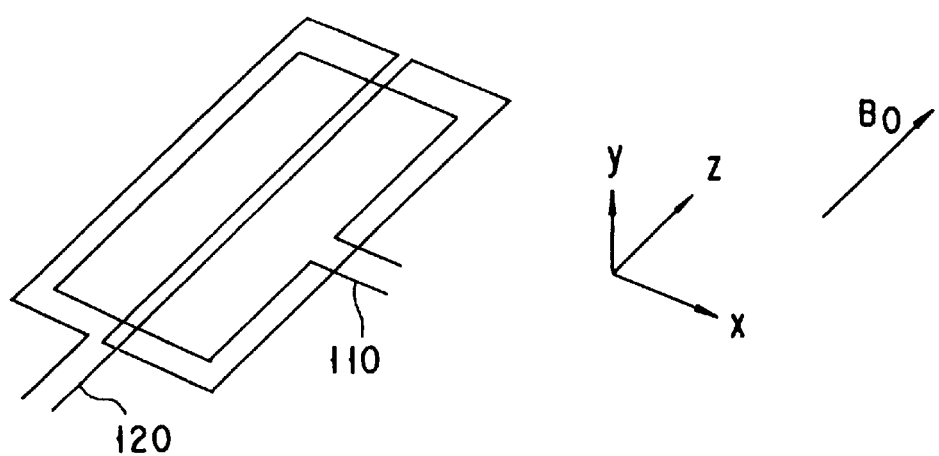
FIG. 17 is a perspective view showing an example of a QD coil according to the prior art.
Figure 18:
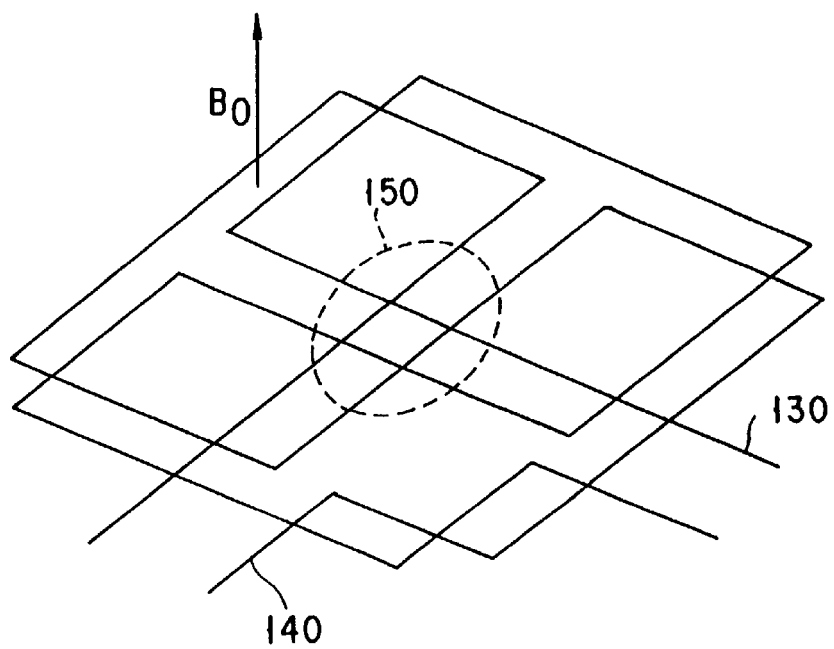
FIG. 18 is a perspective view showing another example of the QD coil according to the prior art.

As shown in FIG. 12, the same widened central conductor coil $C_b$ as in the second embodiment may be utilized for the first coil Ca. More specifically, two 8-shaped coils are used, each having a central conductor split into a plurality of portions. One of the 8-shaped coils has the central conductor in a transit direction of x, and the other 8-shaped coil has the central conductor in a transit direction orthogonal to the x direction, that is, a y direction. Consequently, it is possible to provide a surface QD coil having a high sensitivity over a large plane orthogonal to a static magnetic field direction which is suitable for a vertical field magnetic resonance imaging apparatus.

The present invention is not restricted to the above-mentioned embodiments but may be changed variously.

For example, the above-mentioned RF coil has been a square 8-shaped coil to which the present invention is applied. The present invention can also be applied to other 8-shaped coils, for example, the smooth 8-shaped coil described above.

Although the above-mentioned RF coil has been described to set the direction S of a sensitivity magnetic field to the y direction (in other words, used for a vertical field MRI apparatus), the 8-shaped coil is often used also in a horizontal field MRI apparatus in which the direction of a static magnetic field is parallel with the direction of a body axis. Also in that case, the present invention can fully be applied.

According to the RF coil of the present invention, as described above, the sensitivity is not restricted to the vicinity of the central conductor but can be obtained over a wide range differently from the 8-shaped coil. Furthermore, it is possible to provide a QD coil which is suitable for the vertical field MRI apparatus and has a long sensitivity region along a long subject such as a medulla spinals. In addition, the S/N can be enhanced. Therefore, an image having high diagnostic capability can be obtained and an imaging time can also be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An RF coil to be used for a magnetic resonance imaging apparatus, said coil comprising:

a plate-shaped conductor extending along an x-axis dimension and having a widened transverse dimension along an orthogonal y-axis toward a magnetic field sensitivity of interest which is extended in the y-direction commensurate with said widened transverse dimension; and a return path of a second width less than said first width and without magnetic field sensitivity of interest connected to the plate-shaped conductor.

2. An RF coil as in claim 1, in which said plate-shaped conductor and said return path form an 8-shape.

3. An RF coil as in claim 1, in which a longitudinal direction of the plate-shaped conductor is substantially orthogonal to a direction of a static magnetic field of the imaging apparatus.

4. An RF coil as in claim 1, further comprising:
a reactance element connected serially into said return path.

5. An RF coil as in claim 4, further comprising:
a trap circuit consisting of two diodes connected back to back to each other, which are made conductive as a threshold voltage or higher is applied thereto, and a resonance circuit exhibiting a high impedance as it resonates while the diodes are made conductive.

6. An RF coil as in claim 5, in which said reactance element is part of said resonance circuit.

7. An RF coil assembly to be used for a magnetic resonance imaging apparatus, said coil assembly comprising:
two RF coils having sensitivities for two magnetic fields which are substantially orthogonal to each other respectively, and serving to detect two signals respectively corresponding to the magnetic fields; and
means for shifting the phase of two output signals of the two RF coils with respect to each other by substantially 90° and for synthesizing the two thus resulting output signals into one signal,
in which at least one of the two RF coils comprises:
a plate-shaped conductor extending along an x-axis dimension and having a widened transverse dimension along an orthogonal y-axis toward a magnetic field sensitivity of interest which is extended in the y-direction commensurate with said widened transverse dimension; and
a return path of a second width less than said first width and without magnetic field sensitivity of interest connected to the plate-shaped conductor.

8. An RF coil as in claim 7, in which the plate-shaped conductor and the return path form an 8-shape.

9. A magnetic resonance imaging apparatus comprising:
static magnetic field generating means for generating a static magnetic field to be applied to a subject;
gradient magnetic field generating means for generating a gradient magnetic field to be applied to the subject;
high-frequency pulse generating means for generating a high-frequency pulse for proton excitation;
means for executing a pulse sequence for applying the gradient magnetic field and the high-frequency pulse on predetermined conditions to the subject provided in the static magnetic field;
collecting means for collecting an echo signal related to the proton excitation by the execution of the pulse sequence; and
means for reconstructing the echo signal obtained by the collecting means to obtain a magnetic resonance image of the subject,
in which at least one of the high-frequency pulse generating means and the collecting means comprises:
a plate-shaped conductor extending along an x-axis dimension and having a widened transverse dimension along an orthogonal y-axis toward an magnetic field sensitivity of interest which is extended in the y-direction commensurate with said widened transverse dimension; and
a return path of a second width less than said first width and without magnetic field sensitivity of interest connected to the plate-shaped conductor.

10. An RF coil to be used for a magnetic resonance imaging apparatus, said coil comprising:
a conductor portion including a plurality of conductor paths extending along an x-axis dimension and which are split apart across a first width at a predetermined starting point and joined at a predetermined end point, and having a widened transverse dimension along an orthogonal y-axis toward a magnetic field sensitivity of interest which is extended in the y-direction commensurate with said widened transverse dimension; and
a return path of a second width less than said first width and without magnetic field sensitivity of interest connected to the conductor portion.

11. An RF coil as in claim 10, in which the conductor portion and the return path form an 8-shape.

12. An RF coil as in claim 10, in which each of running directions of the conductor paths is substantially orthogonal to a direction of a static magnetic field of the imaging apparatus.

13. An RF coil as in claim 10, further comprising:
a reactance element serially connected into at least one of the conductor paths.

14. An RF coil as in claim 13, further comprising:
a trap circuit consisting of two diodes connected back to back to each other, which are made conductive as a threshold voltage or higher is applied thereto, and a resonance circuit exhibiting a high impedance as it resonates while the diodes are made conductive.

15. An RF coil as in claim 14, in which said reactance element is a part of said resonance circuit.

16. An RF coil assembly to be used for a magnetic resonance imaging apparatus, said coil assembly comprising:
two RF coils having sensitivities for two magnetic fields which are substantially orthogonal to each other respectively, and serving to detect two signals respectively corresponding to the magnetic fields; and
means for shifting the phase of at least one of the output signals of the two RF coils with respect to the other by substantially 90° and for synthesizing the two resulting output signals into one signal,
in which at least one of the two RF coils comprises:
a conductor portion including a plurality of conductor paths extending along an x-axis dimension and which are split apart across a first width at a predetermined starting point and joined at a predetermined end point, and having a widened transverse dimension along an orthogonal y-axis toward a magnetic field sensitivity of interest which is extended in the y-direction commensurate with said widened transverse dimension; and
a return path of a second width less than said first width and without magnetic field sensitivity of interest connected to the conductor portion.

17. An RF coil as in claim 16, in which the conductor portion and the return path form an 8-shape.

18. A magnetic resonance imaging apparatus comprising:
static magnetic field generating means for generating a static magnetic field to be applied to a subject;
gradient magnetic field generating means for generating a gradient magnetic field to be applied to the subject;

high-frequency pulse generating means for generating a high-frequency pulse for proton excitation;

means for executing a pulse sequence for applying the gradient magnetic field and the high-frequency pulse on predetermined conditions to the subject provided in the static magnetic field;

collecting means for collecting an echo signal related to the proton excitation by the execution of the pulse sequence; and means for reconstructing the echo signal obtained by the collecting means to obtain a magnetic resonance image of the subject, in which at least one of the high-frequency pulse generating means and the collecting means comprises:

a conductor portion including a plurality of conductor paths extending along an x-axis dimension and which are split apart across a first width at a predetermined starting point and joined at a predetermined end point, and having a widened transverse dimension along an orthogonal y-axis toward a magnetic field sensitivity of interest which is extended in the y-direction commensurate with said widened transverse dimension; and a return path of a second width less than said first width and without magnetic field sensitivity of interest connected to the conductor portion.

19. An RF coil for use in a magnetic resonance system, said coil comprising:

at least one RF conductor element having a magnetic field sensitivity of interest and a width sufficient to reduce the rate of change of length for surrounding magnetic field lines of force between the vicinal or adjacent position of RF current passing therethrough and a position orthogonally displaced therefrom as compared to that of conventional conductors; and a return path conductor without magnetic field sensitivity of interest connected to the RP conductor element.

20. An RF coil as in claim 19 wherein:

said RF conductor element is of an elongated plate-shape.

21. An RF coil as in claim 19 wherein:

said RF conductor element comprises a plurality of spaced-apart parallel conductors electrically connected in parallel.

22. An RF coil as in claim 19 wherein:

said RF conductor element comprises at least one plate-shaped conductor having a rectangular cross-section of width greater than height and with its width dimension aligned with the magnetic field sensitivity of interest.

23. An RF coil as in claim 22 wherein said rectangular cross-section width is many times greater than its height.

* * * * *